United States Patent [19]

Kern et al.

[11] 4,097,889
[45] Jun. 27, 1978

[54] COMBINATION GLASS/LOW TEMPERATURE DEPOSITED $SI_wN_xH_yO_z$ PASSIVATING OVERCOAT WITH IMPROVED CRACK AND CORROSION RESISTANCE FOR A SEMICONDUCTOR DEVICE

[75] Inventors: Werner Kern, Belle Mead; Chester Edwin Tracy, South River, both of N.J.

[73] Assignee: RCA Corporation, New York, N.Y.

[21] Appl. No.: 737,850

[22] Filed: Nov. 1, 1976

[51] Int. Cl.² .......................................... H01L 29/34
[52] U.S. Cl. ...................... 357/54; 357/71; 357/73; 427/94
[58] Field of Search ................... 357/54, 23, 71, 73; 427/93, 94, 95

[56] References Cited

U.S. PATENT DOCUMENTS

| 3,422,321 | 1/1969 | Tombs | 357/23 |
|---|---|---|---|
| 3,424,661 | 1/1969 | Androshuk et al. | 357/54 |
| 3,607,697 | 9/1971 | Shirn et al. | 357/54 |
| 3,635,774 | 1/1972 | Ohta | 357/54 |
| 3,745,428 | 7/1973 | Miswa et al. | 357/54 |
| 3,765,935 | 10/1973 | Rand et al. | 357/54 |
| 3,838,442 | 9/1974 | Humphreys | 357/54 |
| 3,967,310 | 6/1976 | Horiuchi et al. | 357/54 |
| 4,001,871 | 1/1977 | Tsunemitsu | 357/54 |
| 4,001,872 | 1/1977 | Khajezadeh | 357/54 |

OTHER PUBLICATIONS

P. Burkhardt, "Composite Silicon Dioxide–Silicon Oxynitride Insulating Layer," IBM Tech. Discl. Bull., vol. 13, #1, Jun. 1970, p. 21.

G. Ackermann et al., "Process for Deposition of Oxynitride," IBM Tech. Discl. Bull. vol. 15, #12, May 1973, p. 3888.

*Primary Examiner*—Joseph E. Clawson, Jr.
*Attorney, Agent, or Firm*—H. Christoffersen; R. P. Williams; T. H. Magee

[57] ABSTRACT

A semiconductor device including a body of semiconductor material with a metallic conductor disposed thereon has a combination glass/low-temperature-(typically 300° C) deposited $Si_wN_xH_yO_z$ passivating overcoat with improved crack and corrosion resistance. This nitride is formed over the conductor, with the glass over the nitride.

7 Claims, 1 Drawing Figure

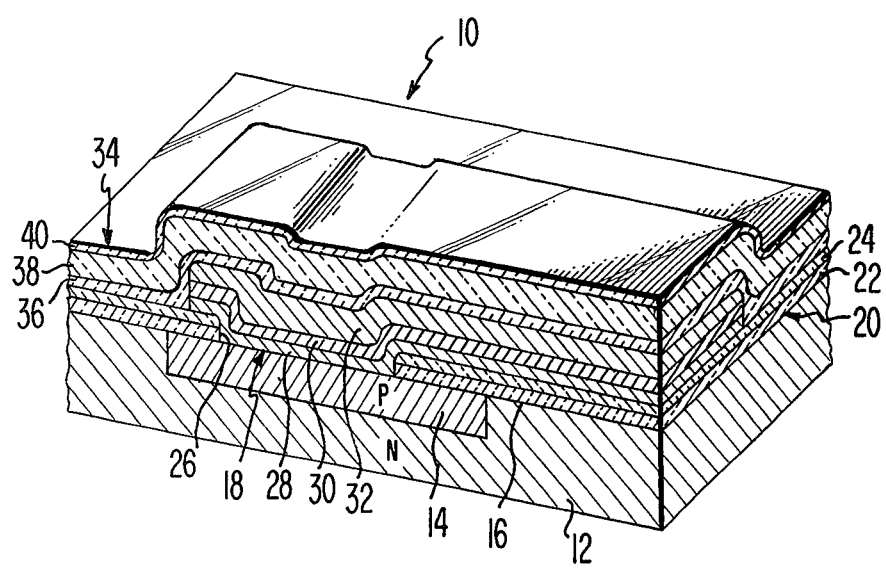

COMBINATION GLASS/LOW TEMPERATURE DEPOSITED SI$_w$N$_x$H$_y$O$_z$ PASSIVATING OVERCOAT WITH IMPROVED CRACK AND CORROSION RESISTANCE FOR A SEMICONDUCTOR DEVICE

This invention relates to a passivating overcoat including a glass layer which is disposed over a metallic conductor of a semiconductor device.

In manufacturing semiconductor devices, processing steps are generally performed in order to protect the device against adverse ambient conditions such as high humidity, corrosive vapors, and mechanical abrasion. Such processing steps are typically labeled as "device passivation" which can be grouped into two main types: (1) primary passivation of the semiconductor device surface at and near the termination of a PN junction, and (2) secondary passivation of the essentially finished, metallized device. Both types of passivation are of great practical importance and hence require a high-quality dielectric material that must serve several important functions. The main difference between the two is that primary passivation must effectively protect the immediate semiconductor surface from deleterious contaminants such as ions, metals, and moisture, whereas secondary passivation must protect the entire device surface — both oxide and metal areas — with an overcoating that immobilizes ionic impurities, prevents the penetration of moisture and harmful gases, and at the same time is sufficiently rugged to provide a high degree of mechanical protection. A typical primary passivating overcoat is disclosed in U.S. Pat. No. 3,597,667, issued to Horn on Aug. 3, 1971, wherein a combination oxide/silicon nitride passivating overcoat is disposed between the semiconductor surface and the device metallization. The silicon nitride (Si$_3$N$_4$) is deposited prior to forming the metallization, preferably by the reaction of a silicon-containing volatile compound at high temperatures (see U.S. Pat. No. 3,917,495 issued to Horn on Aug. 16, 1974).

One of the earliest forms of secondary passivation is the use of a hermetic metal or ceramic package. But with the demand to increase the packing density of chips in circuitry, hermetic packages become unwieldy and expensive. This has lead to the packaging of many semiconductor devices and circuit modules in organic plastic encapsulating materials which are not the equivalent of a hermetic seal. Unless individual chips are sealed at the chip level, electrical parameters often drift with time, especially during operation at high humidity. Although improvements are being made in plastic packaging materials, there are inherent limitations in encapsulating organic compounds with respect to their purity and permeability to moisture and gases. Consequently, improvements in passivation at the chip level of the semiconductor device are highly desirable. Improved secondary passivation is commonly accomplished with glass materials.

Glass passivation is also used in hermetic devices for several reasons. It covers and insulates the metallization interconnect pattern, preventing possible shorting by loose conducting particles in the hermetic can. If the hermetic enclosure should develop a leak, the glass passivation provides an added safety margin for reliability. The mechanical scratch protection and ambient protection provided by the glass passivation of the semiconductor wafer during processing, dicing, mounting, and wire-bonding or semiconductor wafers and pellets is of paramount importance to safeguard reliability and to maintain high product yield.

Glass frit has been utilized to form a vacuum-tight seal in electron tube applications where portions of a metallic pin are adjacent to a glass structure. In order to form an airtight seal between the glass and the protruding metal pins, such pins have been coated with silicon nitride (Si$_3$N$_4$) by heating the pins in an atmosphere consisting essentially of silicon hydride, ammonia, and argon at about 800° C. The pins are then placed in a mold having a cavity shaped according to the desired glass structure, and the cavity is filled with glass frit. The mold is next heated to a relatively high temperature of about 700° C, at which temperature the glass frit fuses together and is heat-sealed to the Si$_3$N$_4$ coating. This heat-sealing process is described in U.S. Pat. No. 3,635,510, issued to Stoller et al. on Jan. 18, 1972 and assigned to RCA Corporation. Such a high temperature heat-sealing process is not used for conventional semiconductor devices which have the device metallization already in place, since such high temperatures would exceed the eutectic temperature at which the metallic portions of the devices would be likely to alloy with the semiconductor material. Also, the glass-like layer used for semiconductor device passivation is typically chemically vapor-deposited over the entire surface of the semiconductor wafer at a temperature below the metal-semiconductor eutectic temperature.

The terms "glassing" and "glass passivation" are commonly used to denote the process in which a glass-like, amorphous, inorganic dielectric layer is formed over the surface of a completed semiconductor wafer. The sequence for glass passivation normally consists of deposition of the dielectric layer over the entire surface of the wafer, which was previously metallized and the metal delineated, followed by photolithographic delineation to remove glass from the central region of bonding pads and from scribe line areas. Typical glass layers include both silicon dioxide (SiO$_2$) and chemically modified silicon dioxide such as, for example, borosilicate glass (BSG, or SiO$_2$ containing chemically-bonded boron trioxide, B$_2$O$_3$) and phosphosilicate glass (PSG, or SiO$_2$ containing chemically-bonded phosphorus pentoxide, P$_2$O$_5$). Such glass layers are generally deposited over the entire surface of the semiconductor wafer using known chemical vapor-depositing techniques. A complete description of one process for chemically vapor-depositing a silicate glass layer is described in U.S. Pat. No. 3,481,781, issued to Werner Kern on Dec. 2, 1969, and assigned to RCA Corporation.

In semiconductor devices having glass layers deposited over metal, cracks and pinholes frequently form in such glass layers when the devices are heated. Such glass layers are typically deposited over metallic conductors such as aluminum or gold, in which the gold may be the top layer of a trimetallization system including a bottom layer of titanium and a middle layer of either platinum or palladium. Glass layers deposited over gold exhibit poor adhesion due to the fact that gold does not readily form a surface oxide that can promote adhesion. As a result, glass layers deposited over gold are of relatively poor quality and invariably crack or peel when heated to about 320° C during subsequent processing steps. Although glass layers deposited over aluminum conductors exhibit better adhesion and less cracking providing the deposition conditions and composition are carefully controlled, such layers may also crack when heated to higher temperatures, such as 450° C. Since cracking degrades the passivating qualities of glass layers, it is highly desirable to have a passivating overcoat which provides better protection for the semiconductor device.

In the drawing:

The FIGURE is a perspective cross-sectional view showing one embodiment of the novel passivating overcoat of the present invention.

Referring to the FIGURE there is shown a semiconductor device 10 comprising a silicon wafer 12, initially of one type conductivity, N type as shown in the present example. The wafer 12 typically includes various regions of N and P type conductivity of which only one P type region 14 is shown in the FIGURE. Above a surface 16 of the wafer 12 is disposed a metallic conductor 18 which interconnects the P type region 14 and various other regions (not shown) into a desired circuit configuration. A primary passivating overcoat 20, comprising typically a layer 22 of silicon dioxide above which is disposed a layer 24 of silicon nitride, is disposed on the surface 16 of the wafer 12. The silicon dioxide layer 22 may be thermally grown by heating the wafer 12 in an oxidizing atmosphere in known manner, while the layer 24 of silicon nitride is typically chemically vapor-deposited (CVD) at high temperature by the chemical reaction of a silicon-containing gas such as silane ($SiH_4$) or silicon tetrachloride ($SiCl_4$), with a nitrogen-containing gas, such as ammonia ($NH_4$) also in known manner. An opening 26 is formed through the layers 22 and 24 to expose a portion of the surface 16 of the wafer 12 where the conductor 18 is to make contact thereto.

The metallic conductor 18 shown in the FIGURE is a multilayered metallization system comprising a first layer 28 of deposited titanium, a second layer 30 of deposited platinum or palladium, and a third layer 32 of deposited gold. All of these layers function as they do in a conventional beam lead system of the type described in U.S. Pat. No. 3,287,612, which issued to Lepselter on Nov. 22, 1966. The advantage of using such a trimetal system is that the gold layer 32 is highly conductive and corrosion-resistant, the layer 28 of titanium forms an adherent bond with the silicon wafer 12 to help prevent lifting of the metallic conductor 18 from the surface 16 thereof, while the layer 30 of platinum or palladium acts as a barrier metal to help insure that the gold does not penetrate to the silicon wafer 12, since this is generally undesirable. Although a trimetal system is illustrated for the metallic conductor 18 shown in the FIGURE, such a conductor may comprise simply a single metallic layer, such as a layer of aluminum.

A secondary passivating overcoat 34 is disposed over the top of the wafer 12 including the unmetallized portions of the layer 24 and the exposed portions of the conductor 18. In accordance with the present invention, the passivating overcoat 34 comprises a combination nitride/glass structure which includes both a low-temperature-deposited nitride layer 36 and a glass layer 38. The expression "low-temperature-deposited" means a nitride layer 38 deposited at a temperature below the eutectic temperature at which the metallic conductor 18 may alloy with the semiconductor material such as, for example, the Au-Si eutectic temperature of about 370° C. The nitride layer 36 has a typical thickness of between about 500A and about 15000A, whereas the glass layer 38 is relatively thicker and has a thickness between about 3,000A and about 30,000A. Referring to the FIGURE, there is illustrated one embodiment for such a combination passivating overcoat 34 wherein the nitride layer 36 is disposed adjacent to the layer 24 and the conductor 18, followed by the glass layer 38. In this embodiment, the nitride layer 36 has a thickness preferably between about 1000A and about 3000A, and the glass layer 38 comprises a phosphosilicate glass (PSG) layer having a thickness between about 10,000A and about 15,000A. If desired, the passivating overcoat 34 may further comprise an additional capping layer 40 of silicon dioxide which has a thickness of between about 1000A and about 2000A and is disposed over the PSG layer, as shown in the FIGURE.

The method used for forming the nitride layer 36 is limited to a relatively low-temperature process due to the fact that the device metallization is already in place at the time that the nitride layer 36 is to be formed. For example, where the conductor 18 comprises gold, the nitride layer 36 should be formed at a temperature between about 50° C and about 350° C, since any gold that may contact the silicon at imperfections in the platinum or palladium barrier layer 30 may alloy with the silicon at the Au-Si eutectic temperature of about 370° C. Although the Al-Si eutectic temperature of about 577° C is slightly higher, a nitride layer cannot be chemically vapor-deposited over aluminum because a high deposition temperature of about 850° C is required in the chemical vapor-deposition processes. Consequently, nitride layers which are chemically vapor-deposited generally have to be deposited prior to forming the device metallization.

In the preferred embodiment, the nitride layer 36 is deposited at relatively low temperature by an rf glow discharge plasma reaction in an atmosphere selected from the group consisting of silane and nitrogen, silane and ammonia, and silane, nitrogen and ammonia. For further information on the known use of a plasma reaction in depositing a nitride layer, see Rosler et al., "A Production Reactor for Low Temperature Plasma-Enhanced Silicon Nitride Deposition", Solid State Technology, June 1976, pages 45 to 50. The nitride layer 36 may also be deposited at low temperature by either reactive rf sputtering in nitrogen using a silicon target, or direct rf sputtering using a silicon nitride target. Such rf sputtering techniques are also known in the art; for further information see J. L. Vossen, "Control of Film Properties by rf-Sputtering Techniques", Journal of Vacuum Science and Technology, Vol. 8, No. 5, Sept./Oct. 1971, pages S12 to S30.

The nitride layer 36, when deposited by glow discharge plasma reaction from silane and nitrogen, with or without ammonia, at typically 300° C, is not stoichiometric $Si_3N_4$ but comprises an amorphous, and probably a polymeric, chemical compound having the formula $Si_wN_xH_yO_z$, wherein $w$, $x$, $y$ and $z$ are integers other than zero. The proportion of these elements differs substantially with deposition conditions, giving rise to nitride layers with widely ranging properties. This conclusion is based to a large extend on infrared spectroscopic data that reveal the presence of Si-N, Si-H, Si-NH-Si, Si-OH, and possibly Si-O and N-H groups.

Low-temperature nitride layers, whether deposited by plasma reaction, reactive rf sputtering, or direct rf sputtering contain background gases as solid solutions or loosely-bonded molecules which tend to make such nitride layers thermodynamically unstable. Any agent, such as heat or impurities, which disturbs this metastable state may cause spontaneous release of the dissolved gas, resulting in blisters or bubbles which degrade the integrity of the secondary passivating overcoat. It has been observed that heating of such nitride layers may cause blistering due to outgassing of the dissolved background gases, such as argon which may become dissolved in nitride layers deposited by rf sputtering. In the preferred embodiment of the present invention, a controlled amount of oxygen or oxygen-containing gas is bled into the reaction chamber so that the low-temperature nitride layer 36 being formed will contain silicon oxynitride. It has been found that nitride layers containing substantial amounts of Si-O linkages are much less prone to blistering, and appear to be much more stable, especially during subsequent heating operations.

The combination glass-nitride passivating overcoat 34 provides an excellent passivating structure which exhibits a greatly improved resistance to cracking, thereby ensuring better protection for semiconductor devices. In the embodiment shown in the FIGURE, the nitride layer 36 forms an improved metal-dielectric bond, provides an alkali and moisture diffusion barrier, and improves substantially the structural quality of the glass layer 38 disposed thereabove as a result of better film nucleation. The thicker glass layer 38 not only provides ample dielectric and mechanical protection for the semiconductor device but also acts as an effective getter for harmful alkali ion impurities such as, for example, sodium ions.

The advantage of using a nitride layer 36 as an adhesion promoting interface between a metallic conductor and an overlying glass layer has been demonstrated in tests, using actual aluminum-metallized or gold-metallized integrated circuits, which show that the usual cracking in such a glass layer can be effectively prevented if a nitride layer is first deposited over the conductor. Referring to Table I, semiconductor devices were subject to a standard bake procedure involving heating the devices in nitrogen at 320° C for a period of 16 hours. All of the aluminum-metallized and gold-metallized devices having an intermediate nitride layer beneath the PSG layer exhibited no cracking whatsoever. For the devices having no nitride layer, two of the three aluminum-metallized devices exhibited cracking, while all of the gold-metallized devices exhibited cracks.

TABLE I

THERMALLY INDUCED CRACK FORMATION IN PASSIVATING OVERCOATS DEPOSITED OVER A METALLIC CONDUCTOR

| METALLIC CONDUCTOR | PASSIVATING OVERCOAT (A) | | | INITIAL APPEARANCE | APPEARANCE AFTER HEAT TREATMENT IN $N_2$ AT 320° C FOR 16 HRS. |
|---|---|---|---|---|---|
| | NITRIDE | PSG | SiO$_2$ | | |
| ALUMINUM | 0 | 7,400 | 0 | NO CRACKS | NO CRACKS |
| ALUMINUM | 0 | 11,200 | 0 | NO CRACKS | SEVERAL CRACKS |
| ALUMINUM | 0 | 11,800 | 0 | NO CRACKS | SEVERAL CRACKS |
| ALUMINUM | 8,700 | 5,500 | 0 | NO CRACKS | NO CRACKS |
| ALUMINUM | 10,300 | 5,500 | 0 | NO CRACKS | NO CRACKS |
| GOLD | 0 | 5,500 | 0 | NO CRACKS | MANY CRACKS |
| GOLD | 0 | 10,050 | 0 | NO CRACKS | MANY CRACKS |
| GOLD | 0 | 15,000 | 2,000 | NO CRACKS | MANY CRACKS |
| GOLD | 5,000 | 5,500 | 0 | NO CRACKS | NO CRACKS |
| GOLD | 15,000 | 5,500 | 0 | NO CRACKS | NO CRACKS |
| GOLD | 2,000 | 15,000 | 2,000 | NO CRACKS | NO CRACKS |

Since semiconductor device packaging, performed subsequent to device passivation, involves exposure of the device to higher temperatures (350°–400° C for gold metallized devices, 500°–520° C for aluminum devices) for short periods of a few minutes, controlled stepwise heating tests, in increments of 50° C for 15 minutes each, were performed starting at 300° C and continuing up to 550° C. Referring to Table II, the three aluminum-metallized devices, passivated with only PSG, exhibited cracks at 300°, 350° and 450° C, respectively; the device having the 11,200A layer of PSG exhibited many cracks beyond 450° C. Aluminum metallized devices, having an intermediate nitride layer, exhibited no cracking whatsoever in the overlying PSG layer up to 550° C and possibly beyond. Thus, an intermediate nitride layer can retard crack formation in PSG layers over aluminum by at least 100° C, and help to ensure the absence of cracking in PSG layers up to at least 550° C. For gold-metallized devices, Table II shows that PSG layers deposited over gold without an intermediate nitride layer exhibited slight cracking at 300° C and severe cracking at 400° C. However, by depositing an intermediate nitride layer, such PSG layers did not develop cracks until about 550° C. Thus, an intermediate nitride layer can retard crack formation in PSG layers over gold by approximately 250° C.

TABLE II

THERMALLY INDUCED CRACK FORMATION IN PASSIVATING OVERCOATS DEPOSITED OVER A METALLIC CONDUCTOR

| METALLIC CONDUCTOR | PASSIVATING OVERCOAT (A) | | INITIAL APPEARANCE | APPEARANCE AFTER SUCCESSIVE 15 MIN TREATMENTS IN AIR AT | | | | | |
|---|---|---|---|---|---|---|---|---|---|
| | NITRIDE | PSG | | 300° C | 350° C | 400° C | 450° C | 500° C | 550° C |
| ALUMINUM | 0 | 7,400 | NO CRACKS | SAME | SAME | SAME | FEW CRACKS | SAME | SAME |
| ALUMINUM | 0 | 11,200 | NO CRACKS | SAME | FEW CRACKS | SAME | SEVERAL CRACKS | MANY CRACKS | MANY CRACKS |
| ALUMINUM | 0 | 11,800 | NO CRACKS | FEW CRACKS | SAME | SAME | SEVERAL CRACKS | SAME | SAME |
| ALUMINUM | 8,700 | 5,500 | NO CRACKS | SAME | SAME | SAME | SAME | SAME | SAME |
| ALUMINUM | 10,300 | 5,500 | NO CRACKS | SAME | SAME | SAME | SAME | SAME | SAME |
| GOLD | 0 | 5,500 | NO CRACKS | FEW CRACKS | SAME | MANY CRACKS | SAME | SAME | SAME |

TABLE II-continued

THERMALLY INDUCED CRACK FORMATION IN PASSIVATING OVERCOATS DEPOSITED OVER A METALLIC CONDUCTOR

| METALLIC CONDUCTOR | PASSIVATING OVERCOAT (A) | | INITIAL APPEARANCE | APPEARANCE AFTER SUCCESSIVE 15 MIN TREATMENTS IN AIR AT | | | | | |
|---|---|---|---|---|---|---|---|---|---|
| | NITRIDE | PSG | | 300° C | 350° C | 400° C | 450° C | 500° C | 550° C |
| GOLD | 5,000 | 5,500 | NO CRACKS | SAME | SAME | SAME | SAME | SAME | FEW CRACKS |
| GOLD | 15,000 | 5,500 | NO CRACKS | SAME | SAME | SAME | SAME | SAME | FEW CRACKS |

The foregoing tests shown that a combination nitride glass passivating overcoat is superior to a passivating overcoat of glass alone, when deposited over a metallized semiconductor device. Although a low-temperature deposited nitride layer by itself would not provide adequate dielectric protection needed for effective overcoat passivation because such nitride layers exhibit poor structural integrity, a combination nitride/glass structure provides a passivating overcoat which is much more thermally stable and, hence, offers substantially improved integrity against cracking. While such an overcoat is desirable over aluminum-metallized devices, the effect is much greater for semiconductor devices having the trimetallization system where the nitride layer is deposited over gold. Experiments have shown that an intermediate nitride layer deposited over a gold-metallized device greatly improves dielectric-metal adhesion and edge coverage, while increasing by about 250° C the temperature at which crack formation sets in.

What is claimed is:

1. In a semiconductor device having a metallic conductor disposed on the surface of a body of semiconductor material and a passivating overcoat including a glass layer disposed over said conductor, the improvement comprising said passivating overcoat further including a low-temperature-deposited nitride layer comprising a chemical compound having the formula $Si_wN_xH_yO_z$, wherein $w$, $x$, $y$ and $z$ are integers other than zero said nitride layer being deposited at a temperature below the eutectic temperature at which said metallic conductor begins to alloy with said semiconductor material.

2. A semiconductor device as defined in claim 1 wherein said nitride layer is disposed adjacent to said conductor between said conductor and said glass layer.

3. A semiconductor device as defined in claim 1 wherein said nitride layer further includes silicon oxynitride.

4. A semiconductor device as defined in claim 1 wherein said nitride layer has a thickness of between about 500A and about 15,000A.

5. A semiconductor device as defined in claim 1 wherein said glass layer is phosphosilicate glass and has a thickness of between about 3,000A and about 30,000A.

6. A semiconductor device as defined in claim 1 wherein said conductor comprises a layer of aluminum.

7. A semiconductor device as defined in claim 1 wherein said conductor comprises a first layer of titanium, a second layer of one of platinum and palladium, and a third layer of gold, said gold layer being adjacent to said nitride layer.

* * * * *